United States Patent [19]

Yu et al.

[11] Patent Number: 5,700,737
[45] Date of Patent: Dec. 23, 1997

[54] PECVD SILICON NITRIDE FOR ETCH STOP MASK AND OZONE TEOS PATTERN SENSITIVITY ELIMINATION

[75] Inventors: Chen-Hua Yu, Keelung; Syun-Ming Jang, Hsin-chu, both of Taiwan

[73] Assignee: Taiwan Semiconductor Manufactured Company Ltd., Hsin-chu, Taiwan

[21] Appl. No.: 606,955

[22] Filed: Feb. 26, 1996

[51] Int. Cl.⁶ .................................................. H01L 21/465
[52] U.S. Cl. .................... 438/636; 438/637; 438/724; 438/667
[58] Field of Search .................... 437/195, 190, 437/192, 194, 197, 198; 438/636, 634, 637, 654, 656, 667, 724, 735, 737

[56] References Cited

U.S. PATENT DOCUMENTS

| | | | |
|---|---|---|---|
| 5,219,788 | 6/1993 | Abernathy et al. | 437/187 |
| 5,269,879 | 12/1993 | Rhoades et al. | 156/643 |
| 5,451,543 | 9/1995 | Woo et al. | 437/195 |

FOREIGN PATENT DOCUMENTS

| | | |
|---|---|---|
| 62-293619 | 12/1987 | Japan. |
| 1-241125 | 9/1989 | Japan. |
| 2-291131 | 11/1990 | Japan. |
| 3-74844 | 3/1991 | Japan. |
| 3-133129 | 6/1991 | Japan. |
| 5-94974 | 4/1993 | Japan. |
| 6-104227 | 4/1994 | Japan. |
| 7-944492 | 4/1995 | Japan. |

OTHER PUBLICATIONS

S. Wolf, "Silicon Processing for the VLSI Era–vol. 2" Lattice Press, Sunset Beach, CA, 1990, pp. 198–199.
S. Wolf et al. "Silicon Processing for the VLSI Era vol. I" Lattice Press (Calif.) (1986) p. 171.

Primary Examiner—Jey Tsai
Assistant Examiner—C. Everhart
Attorney, Agent, or Firm—George O. Saile; Stephen B. Ackerman; Larry J. Prescott

[57] ABSTRACT

This invention provides a method for forming dense electrode patterns having a high aspect ratio in a conductor metal layer. The method uses silicon nitride deposited using plasma enhanced chemical vapor deposition, PECVD, as an etch stop mask to protect the conductor metal and anti reflection coating when etching the electrode patterns. The PECVD silicon nitride is also used a mask to eliminate pattern dependence when forming inter-metal dielectric layers. The PECVD silicon nitride is also used as an etch stop mask when forming vias in the inter-metal dielectric for electrical conduction between electrode pattern layers.

19 Claims, 5 Drawing Sheets

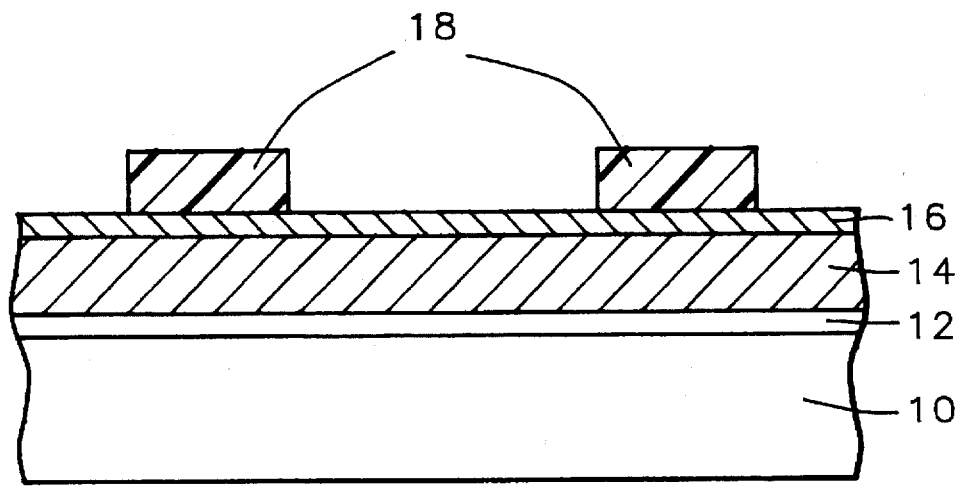
*FIG. 1A – Prior Art*
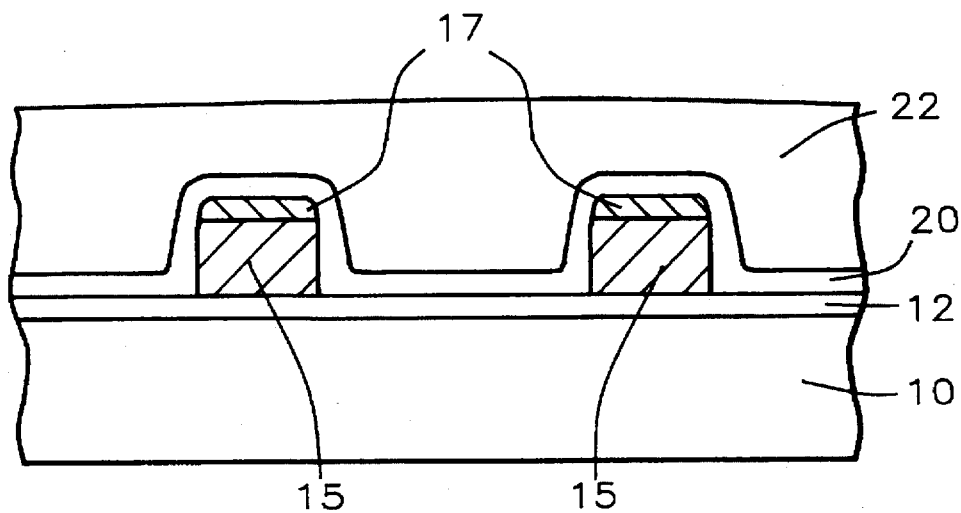
*FIG. 1B – Prior Art*

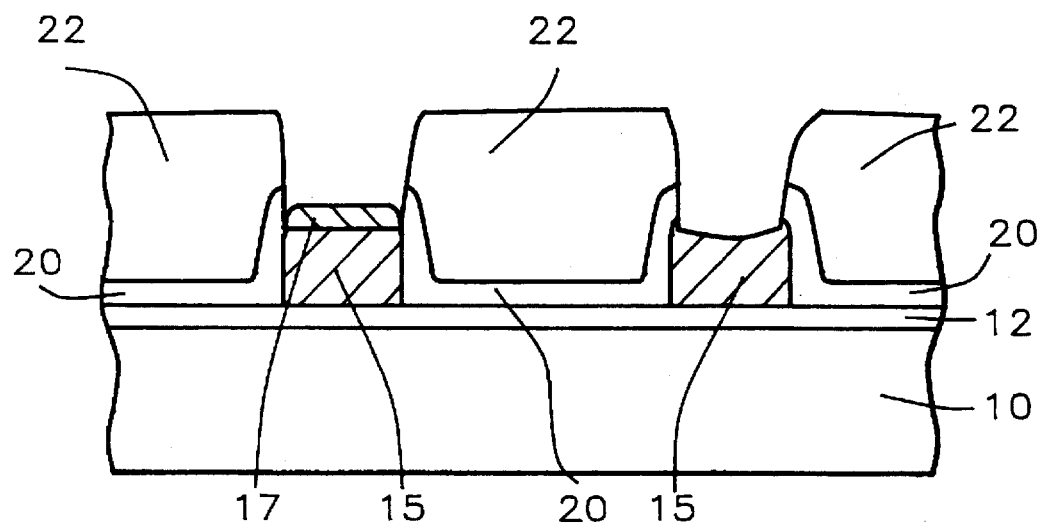
FIG. 1C – Prior Art
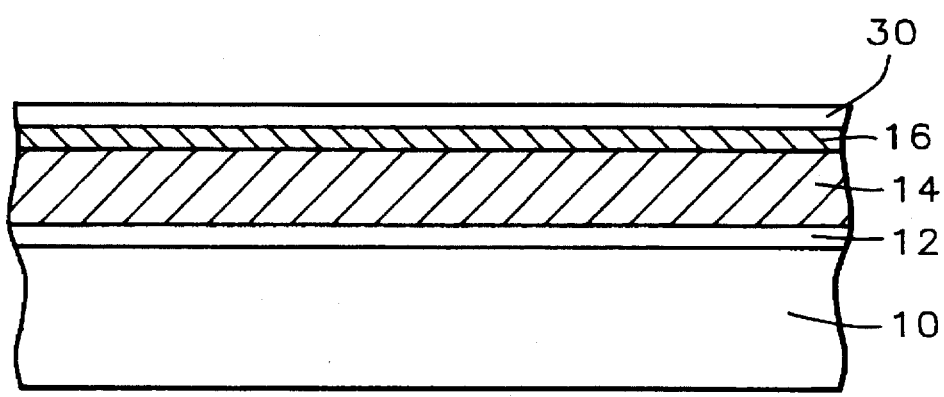
FIG. 2

PECVD SILICON NITRIDE FOR ETCH STOP MASK AND OZONE TEOS PATTERN SENSITIVITY ELIMINATION

BACKGROUND OF THE INVENTION

(1) Field of the Invention

This invention relates to etching a dense electrode pattern having a high aspect ratio in conductor metal, to covering the electrode pattern with an inter-metal dielectric, and to forming via holes in the inter-metal dielectric. The invention relates more particularly to the use of silicon nitride deposited using plasma enhanced chemical vapor deposition as an etch stop and as a mask to remove pattern sensitivity from the formation of the inter-metal dielectric.

(2) Description of the Related Art

Inter-metal dielectric formation is discussed in "SILICON PROCESSING FOR THE VLSI ERA—Vol. 2," by S. Wolf, Lattice Press, Sunset Beach, Calif., 1990, pages 198–199. Wolf discusses plasma enhanced chemical vapor deposition and plasma enhanced TEOS to form silicon dioxide and silicon nitride films for an inter-metal dielectric.

Methods of filling vias with metal are discussed in "SILICON PROCESSING FOR THE VLSI ERA—Vol. 2," by S. Wolf, Lattice Press, Sunset Beach, Calif., 1990, pages 241–244. Wolf describes methods for filling vias with metal but does not describe the methods taught by the invention of this Patent Application.

This invention teaches the use of a silicon nitride film deposited using plasma enhanced chemical vapor deposition. The silicon nitride film forms an etch stop used to achieve dense electrode patterns having a high aspect ratio in a conductor metal layer. The silicon nitride film is also used to remove the pattern sensitivity in the formation of an inter-metal dielectric layer covering dense electrode patterns having a high aspect ratio. The silicon nitride film is also used as an etch stop when etching vias in the inter-metal dielectric.

SUMMARY OF THE INVENTION

In the manufacture of integrated circuit elements the problem of etching a dense pattern of narrow electrode lines having a high aspect ratio and in insulating those lines with an inter-metal dielectric after they have been etched increases as the circuit density, and thus the pattern density, increases. FIG. 1A shows a cross section view of an integrated circuit element substrate 10 having a layer of base dielectric 12 and a layer of metal 14 for the electrode pattern. There is a layer of anti reflection material 16 formed on the layer of metal 14 and a photoresist mask 18 formed on the layer of anti-reflection material 16. In etching high aspect ratio electrodes there is a problem etching the electrodes without degrading the width at the top of the electrode in order to completely etch the depth of the electrode. Simply increasing the thickness of the photoresist results in degradation of resolution due to the inability to resolve narrow electrode patterns. Anti reflection coatings are often used in electrode patterns requiring high resolution and deterioration of the anti reflection coating during etching is also a problem during etching of high aspect ratio electrode patterns.

As shown in FIG. 1B, after the formation of a dense high aspect ratio electrode pattern 15, with an antireflection coating 17 on the electrodes, it is frequently necessary to form an inter-metal dielectric layer 22 over the electrode pattern 15 in preparation for another electrode pattern layer, not shown, to be formed. Frequently ozone—tetraethyl orthosilicate, $O_3$-TEOS, is used to form the inter-metal dielectric 22. However, in forming the inter-metal dielectric layer using $O_3$-TEOS the quality of inter-metal dielectric layer can be affected by the electrode pattern for dense electrode patterns having a high aspect ratio. An oxide under layer 20 using plasma enhanced chemical vapor deposition can be used to reduce the pattern sensitivity of the $O_3$-TEOS inter-metal dielectric layer, however this requires extra processing and the pattern sensitivity is not completely eliminated.

Additional problems can be encountered in the formation of via holes in the inter-metal dielectric for forming electrical contacts between two levels of electrode patterns. As shown in FIG. 1C, any irregularities in the thickness of the inter-metal dielectric layer 22 can lead to via holes which either do not open completely or to etching through the anti-reflection coating 17 on that part of the metal electrode 15 directly under the via hole or to the etching away of part of the metal electrode 15 directly under the via hole.

It is a principle objective of this invention to provide a method of etching dense electrode patterns having a high aspect ratio which will not degrade the electrode width at the top of the electrode, will not degrade antireflection coatings on the electrodes, and will allow the formation of inter-metal dielectric layers without the need of an oxide under layer.

It is another principle objective of this invention to provide a method of forming via holes in the inter-metal dielectric formed to provide electrical conduction between two layers of electrodes which will be insensitive to variations in the inter-metal dielectric thickness.

These objectives are achieved by means of a method using a silicon nitride etch stop layer, deposited using plasma enhanced chemical vapor deposition, formed on the anti reflection coating prior to forming the photoresist layer for forming the dense electrode pattern prior to etching the dense electrode pattern.

BRIEF DESCRIPTION OF THE DRAWINGS

FIG. 1A shows a cross section view of an integrated circuit element substrate after formation of the photoresist mask for a conventional method of forming dense electrode pattern.

FIG. 1B shows a cross section view of an integrated circuit element substrate after using a conventional method to form a dense electrode pattern.

FIG. 1C shows a cross section view of an integrated circuit element substrate after forming via holes in the inter-metal dielectric layer using conventional methods.

FIG. 2 shows a cross section view of an integrated circuit element substrate with a base dielectric layer, a electrode metal layer, an anti reflection coating, and a silicon nitride layer deposited thereon.

DESCRIPTION OF THE PREFERRED EMBODIMENTS

Figure 3:
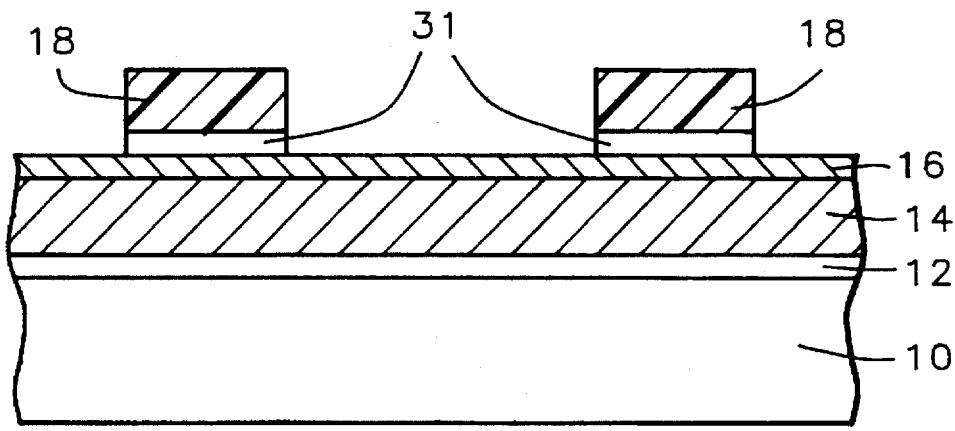
FIG. 3 shows a cross section view of an integrated circuit element substrate after formation of the photoresist mask and the silicon nitride etch stop mask of this invention for forming a dense electrode pattern.
Figure 4:
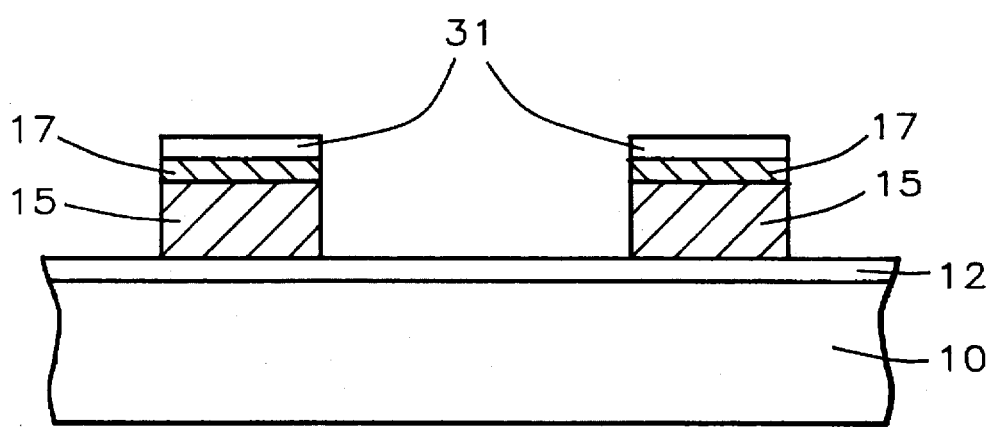
FIG. 4 shows a cross section view of an integrated circuit element substrate after formation of the dense electrode pattern using the silicon nitride etch stop of this invention.

Refer now to FIGS. 2–4, there is shown the method for forming a dense electrode pattern with a large aspect ratio using the silicon nitride etch stop of this invention. FIG. 2 shows a cross section view of an integrated circuit element substrate 10 with devices, not shown, formed therein and a base dielectric layer 12, such as silicon dioxide, deposited thereon. A layer of conductor metal 14, such as aluminum/copper or the like, is deposited on the base dielectric layer 12. The conductor metal layer 14 has contacts, not shown, through the base dielectric layer 12 to the devices in the integrated circuit element substrate 10 at selected points. An anti reflection coating 16 is formed on the conductor metal layer 14. The anti reflection coating 16 is formed of a material such as titanium nitride, TiN, having a thickness of between about 100 and 1400 Angstroms. A silicon nitride, SiN, layer 30 having a thickness of between about 200 and 2000 Angstroms is deposited on the anti reflection coating 16 using plasma enhanced chemical vapor deposition. The silicon nitride layer 30 will be used to form the etch stop.

As shown in FIG. 3, a photoresist mask 18 of the electrode pattern is then formed on the silicon nitride layer using photolithographic techniques. The electrode pattern is then formed in the silicon nitride layer using the photoresist mask 18 and anisotropic dry etching using $CF_4+CHF_3$ as the etchant to form a silicon nitride etch stop mask 31. The electrode pattern is then formed in the antireflection coating 16 and in the conductor metal layer 14 using the photoresist mask 18 and the silicon nitride etch stop mask 31 and anisotropic dry etching using $BCl_3+Cl_2$ as the etchant, since this etchant will not etch the silicon nitride.

As shown in FIG. 4, the photoresist mask is then stripped leaving the electrode pattern in the conductor metal 15, the electrode pattern in the anti reflection coating 17, and the silicon nitride etch stop mask 31. The silicon nitride etch stop mask 31 protects the electrode pattern in the anti reflection coating 17 and the electrode pattern in the conductor metal 15 during the etching away of the remainder of the anti reflection coating and the remainder of conductor metal layer. The resulting electrode pattern has a good quality cross section even for high aspect ratio electrode patterns.

Figure 5:
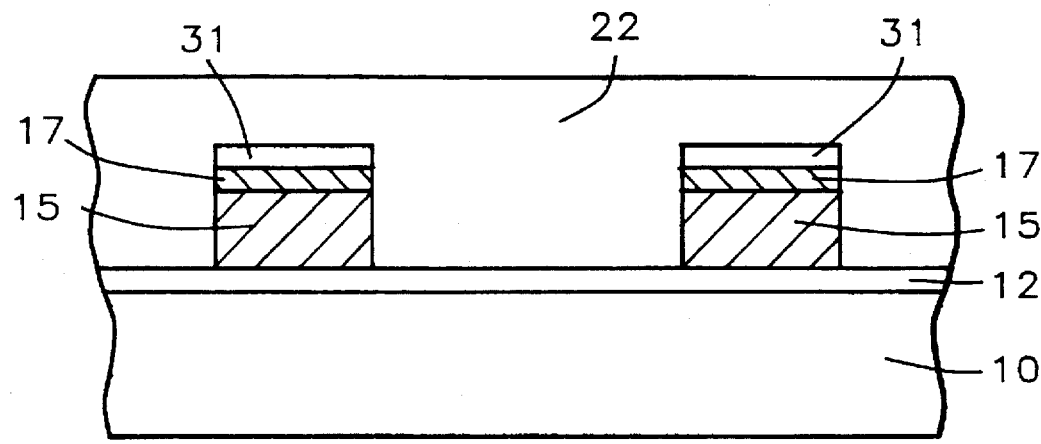
FIG. 5 shows a cross section view of an integrated circuit element substrate after formation of the dense electrode pattern, the silicon nitride etch stop, and the inter-metal dielectric layer.

Next, as shown in FIG. 5, an inter-metal dielectric layer 22 is deposited on the integrated circuit element substrate 10 covering the base dielectric layer 12, the conductor metal electrode pattern 15, the anti reflection coating electrode pattern 17, and the silicon nitride etch stop mask 31. The inter-metal dielectric layer 22 is a material such as silicon dioxide deposited using ozone—tetra-ethyl-ortho-silicate, $O_3$-TEOS, having a thickness of between about 5000 and 10,000 Angstroms. The silicon nitride etch stop mask 31 eliminates any dependency of the quality of the inter-metal dielectric layer 22 on the conductor metal electrode pattern 15 and no oxide under layer is required.

Refer now to FIGS. 5–8, there is shown an embodiment of a method of forming via holes in the inter-level dielectric for achieving electrical conduction between two layers of electrodes. As shown in FIG. 5, The first part of this embodiment is exactly like the previous embodiment. A base dielectric layer 12, such as silicon dioxide, is formed on an integrated circuit element substrate 10. A first level electrode pattern of conductor metal 15, such as aluminum/copper or the like, having contact regions, is formed on the base dielectric layer 12. An anti reflection coating 17, such as titanium nitride, TiN, having a thickness of between about 50 and 1500 Angstroms, is formed on the conductor metal first level electrode pattern 15 and a silicon nitride etch stop mask 31, having a thickness of between about 200 and 2000 Angstroms, is formed on the anti reflection coating 17. An inter-metal dielectric layer 22, such as silicon dioxide, deposited using $O_3$-TEOS and having a thickness of between about 5000 and 10,000 Angstroms, is deposited on the integrated circuit element substrate 10 covering the base dielectric layer 12, the conductor metal first level electrode pattern 15, the anti reflection coating 17, and the silicon nitride etch stop mask 31. Up to this point this embodiment is like the previously described embodiment.

Figure 6:
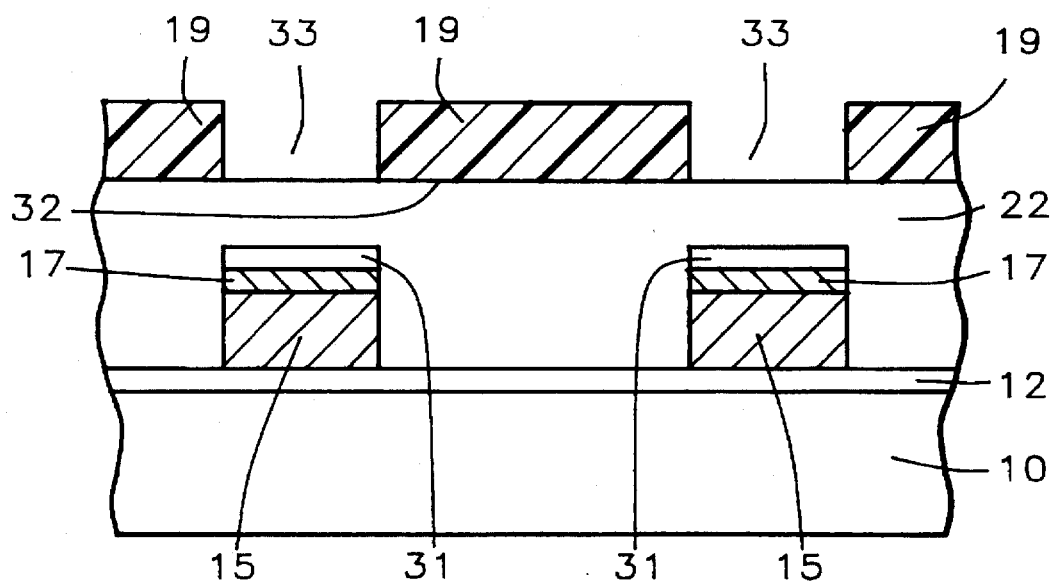
FIG. 6 shows a cross section view of an integrated circuit element substrate after formation of the dense electrode pattern, the silicon nitride etch stop, the inter-metal dielectric layer, and the photoresist mask used to form via holes in the inter-metal dielectric.
Figure 7:
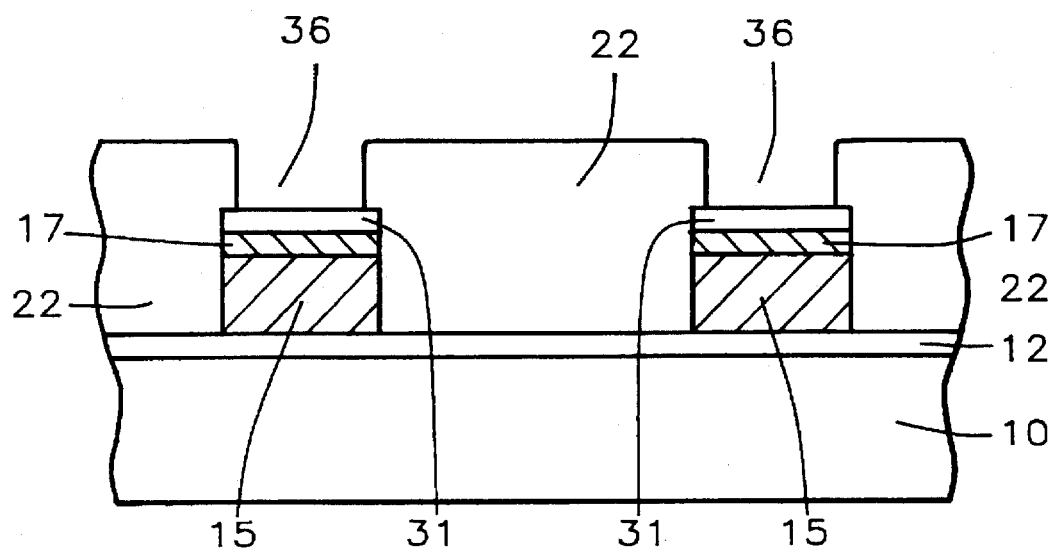
FIG. 7 shows a cross section view of an integrated circuit element substrate after formation of the dense electrode pattern, the silicon nitride etch stop, the inter-metal dielectric layer, and the via holes in the inter-metal dielectric layer.

As shown in FIG. 6, a photoresist mask 19, having contact holes 33 directly over the contact regions of the conductor metal first level electrode pattern, is formed on the inter-metal dielectric 22. Next, as shown in FIG. 7, that part of the inter-level dielectric layer directly over the first level electrode pattern contact regions is etched away using the photoresist mask 19 having contact holes 33 and anisotropic dry etching using $C_4F_8+CO$ as the etchants. As shown in FIG. 6, the top surface 32 of the inter-metal dielectric 19 may not be planar so that the amount of inter-metal dielectric which must be removed may not be the same for each via hole. The etchants used to etch the silicon dioxide inter-metal dielectric 19 will not significantly etch the silicon nitride etch stop mask 31 so that etching time is not critical and all of the inter-metal dielectric can be removed from the contact hole 36 without damage to the anti reflection coating 17 or the conductor metal 15 directly below the contact hole 36.

Figure 8:
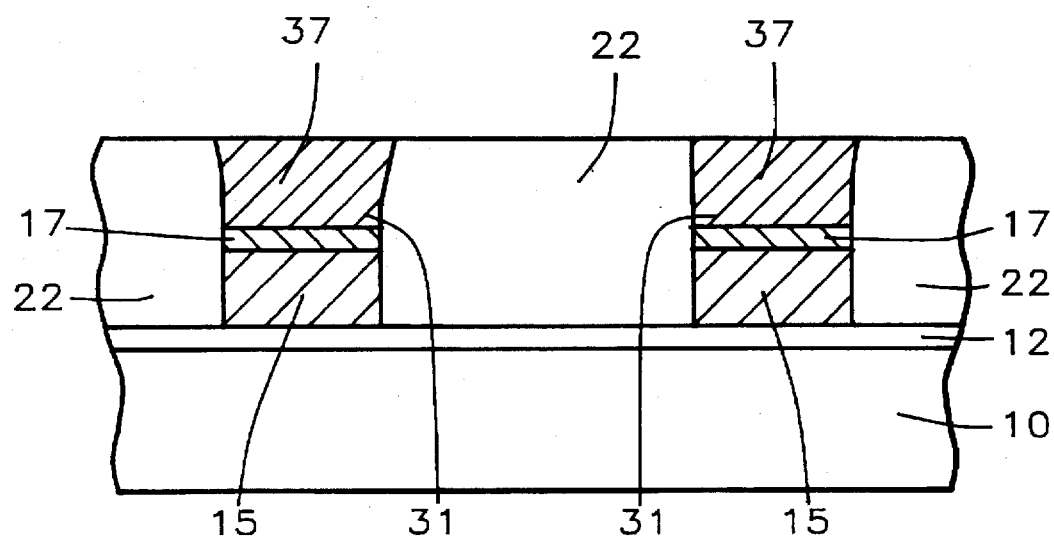
FIG. 8 shows a cross section view of an integrated circuit element substrate after the via holes in the inter-metal dielectric layer have been filled with via metal.

Next, as shown in FIG. 8, the silicon nitride etch stop mask is removed using dry etching with $CF_4+CHF_3+SF_6$ as the etchants. Combinations such as $CF_4+CHF_3$, $CF_4+SF_6$, or $CHF_3+SF_6$ may also be used as the etchants. The via hole is then filled with a via metal 37, such as aluminum/copper or the like. The integrated circuit element is then ready for the second level electrode pattern, not shown, to be formed on the inter-metal dielectric.

While the invention has been particularly shown and described with reference to the preferred embodiments thereof, it will be understood by those skilled in the art that various changes in form and details may be made without departing from the spirit and scope of the invention.

What is claimed is:

1. A method of forming electrode patterns, comprising the steps of:

providing an integrated circuit element having devices formed therein;

providing a base dielectric layer formed on said integrated circuit element;

forming a conductor metal layer on said base dielectric layer;

forming an antireflection material layer on said conductor metal layer, wherein said antireflection material is titanium nitride;

forming a silicon nitride etch stop layer on said antireflection material layer;

forming a photoresist layer on said silicon nitride etch stop layer;

forming an electrode pattern in said photoresist using photolithographic techniques;

forming said electrode pattern in said silicon nitride etch stop layer by means of anisotropic dry etching using said electrode pattern formed in said photoresist as a mask and a first etchant;

forming said electrode pattern in said antireflection material by means of anisotropic dry etching using said electrode pattern formed in said photoresist and said electrode pattern formed in said silicon nitride etch stop layer as a mask and $BCl_3+Cl_2$ as an etchant;

forming said electrode pattern in said conductor metal by means of anisotropic dry etching using said electrode pattern formed in said photoresist and said electrode pattern formed in said silicon nitride etch stop layer as a mask and a third etchant;

removing said electrode pattern formed in said photoresist; and forming an inter-metal dielectric layer over said integrated circuit element covering said electrode pattern formed in said silicon nitride, said electrode pattern formed in said antireflection material, said electrode pattern formed in said conductor metal, and said base dielectric layer.

2. The method of claim 1 wherein said silicon nitride etch stop layer is formed using plasma enhanced chemical vapor deposition.

3. The method of claim 1 wherein said silicon nitride layer has a thickness of between about 200 and 2000 Angstroms.

4. The method of claim 1 wherein said antireflection material layer has a thickness of between about 50 and 1500 Angstroms.

5. The method of claim 1 wherein said inter-metal dielectric layer is silicon dioxide formed using ozone—tetra-ethyl-ortho-silicate.

6. The method of claim 1 wherein said conductor metal is aluminum copper.

7. The method of claim 1 wherein said first etchant is $CF_4+CHF_3$.

8. The method of claim 1 wherein said third etchant is $BCl_3+Cl_2$.

9. A method of forming vias in dielectric material, comprising the steps of:

providing an integrated circuit element having devices formed therein;

providing a base dielectric layer formed on said integrated circuit element;

forming a conductor metal layer having contact regions on said base dielectric layer;

forming an antireflection material layer on said conductor metal layer;

forming a silicon nitride etch stop layer on said antireflection material layer formed on said conductor metal layer wherein said antireflection material layer is between said silicon nitride etch stop layer and said conductor metal layer;

forming a first photoresist layer on said silicon nitride etch stop layer;

forming an electrode pattern in said first photoresist layer wherein said electrode pattern includes said contact regions;

forming said electrode pattern in said silicon nitride etch stop layer by means of etching using said electrode pattern formed in said first photoresist layer as a mask;

forming said electrode pattern in said antireflection material layer by means of etching using said electrode pattern formed in said etch stop layer and said electrode pattern formed in said first photoresist layer as a mask;

forming said electrode pattern in said conductor metal layer by means of etching using said electrode pattern formed in said etch stop layer and said electrode pattern formed in said first photoresist layer as a mask;

removing said electrode pattern formed in said first photoresist layer;

forming an inter-metal dielectric layer over said integrated circuit element covering said electrode pattern formed in said conductor metal layer, said antireflection material layer, and said silicon nitride etch stop layer;

forming a layer of second photoresist having holes wherein said holes in said layer of second photoresist are directly over said contact regions of said electrode pattern formed in said conductor metal layer;

forming via holes in said inter-metal dielectric layer directly over said contact regions of said electrode pattern formed in said conductor metal layer by means of dry etching using said layer of second photoresist having holes as a mask and a first etchant wherein said first etchant will not remove said silicon nitride etch stop layer, thereby exposing that part of said silicon nitride etch stop layer directly over said contact regions of said electrode pattern formed in said conductor metal layer;

removing that part of said silicon nitride etch stop layer directly over said contact regions of said electrode pattern formed in said conductor metal layer after said via holes in said inter-metal dielectric layer have been formed by means of dry etching using said layer of second photoresist having holes and said via holes in said inter-metal dielectric layer as a mask and a second etchant;

removing said layer of second photoresist having holes; and filling said via holes in said inter-metal dielectric layer with a via metal.

10. The method of claim 9 wherein said silicon nitride etch stop layer is formed using plasma enhanced chemical vapor deposition.

11. The method of claim 9 wherein said silicon nitride etch stop layer has a thickness of between about 200 and 2000 Angstroms.

12. The method of claim 9 wherein said antireflection material layer is titanium nitride.

13. The method of claim 9 wherein said antireflection material layer has a thickness of between about 50 and 1500 Angstroms.

14. The method of claim 9 wherein said interlevel dielectric layer is silicon dioxide formed using ozone—tetraethyl orthosilicate.

15. The method of claim 9 wherein said conductor metal layer is aluminum copper.

16. The method of claim 9 wherein said first etchant is $C_4F_8+CO$.

17. The method of claim 9 wherein said second etchant comprises $CF_4$ and $CHF_3$.

18. The method of claim 9 wherein said second etchant comprises $CF_4$ and $SF_6$.

19. The method of claim 9 wherein said second etchant comprises $CHF_3$ and $SF_6$.

* * * * *